United States Patent
Jin et al.

(10) Patent No.: US 12,022,693 B2
(45) Date of Patent: Jun. 25, 2024

(54) DISPLAY PANEL AND MANUFACTURING METHOD THEREOF, DISPLAY DEVICE WITH IMPROVED BRIGHTNESS UNIFORMITY

(71) Applicant: BOE TECHNOLOGY GROUP CO., LTD., Beijing (CN)

(72) Inventors: Qian Jin, Beijing (CN); Wei Huang, Beijing (CN); Kai Sui, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 211 days.

(21) Appl. No.: 17/352,447

(22) Filed: Jun. 21, 2021

(65) Prior Publication Data

US 2022/0059627 A1 Feb. 24, 2022

(30) Foreign Application Priority Data

Aug. 21, 2020 (CN) .......................... 202010852319.2

(51) Int. Cl.
| | |
|---|---|
| *H10K 59/122* | (2023.01) |
| *H10K 50/813* | (2023.01) |
| *H10K 50/822* | (2023.01) |
| *H10K 50/84* | (2023.01) |
| *H10K 50/856* | (2023.01) |
| *H10K 50/858* | (2023.01) |

(Continued)

(52) U.S. Cl.
CPC ......... *H10K 59/122* (2023.02); *H10K 50/813* (2023.02); *H10K 50/822* (2023.02); *H10K 50/84* (2023.02); *H10K 50/856* (2023.02); *H10K 50/858* (2023.02); *H10K 71/00* (2023.02); *H10K 71/135* (2023.02)

(58) Field of Classification Search
CPC .... H10K 59/122; H10K 71/135; H10K 71/00; H10K 50/84; H10K 50/858; H10K 50/856; H10K 50/822; H10K 50/813
USPC ...................................................... 257/40, 59
See application file for complete search history.

(56) References Cited

U.S. PATENT DOCUMENTS

| | | | |
|---|---|---|---|
| 2005/0023974 A1* | 2/2005 | Chwang ............... | H10K 50/844 313/511 |
| 2007/0269621 A1 | 11/2007 | Mitsuhashi et al. | |

(Continued)

FOREIGN PATENT DOCUMENTS

| | | |
|---|---|---|
| CN | 101076211 A | 11/2007 |
| CN | 104409647 A | 3/2015 |

(Continued)

OTHER PUBLICATIONS

China National Intellectual Property Administration, First office action of Chinese application No. 202010852319.2 dated Dec. 2, 2022, which is foreign counterpart application of this US application.

*Primary Examiner* — Eric W Jones
(74) *Attorney, Agent, or Firm* — Lippes Mathias LLP (57) ABSTRACT

The present application discloses a display panel, and a manufacturing method thereof, and a display device, which belong to the field of display technologies. The display panel includes a substrate, and a pixel defining layer and a light-emitting device which are disposed on the substrate. In the light-emitting device, a central region of the light-emitting layer covers a first electrode, and a peripheral region of the light-emitting layer is staggered from the first electrode.

17 Claims, 7 Drawing Sheets

(51) Int. Cl.
 H10K 71/00 (2023.01)
 H10K 71/13 (2023.01)

(56) References Cited

U.S. PATENT DOCUMENTS

| | | |
|---|---|---|
| 2016/0293683 A1 | 10/2016 | Hou et al. |
| 2016/0315290 A1* | 10/2016 | Zhang .................... H10K 59/12 |
| 2017/0125740 A1* | 5/2017 | Lee ....................... H10K 50/856 |
| 2017/0194395 A1 | 7/2017 | Hu et al. |
| 2018/0184501 A1 | 6/2018 | Park et al. |
| 2018/0269430 A1* | 9/2018 | Kojima ................ H10K 50/816 |
| 2019/0115404 A1* | 4/2019 | Moon .................... H10K 50/82 |
| 2019/0157354 A1* | 5/2019 | Lee ....................... H01L 33/501 |
| 2020/0013990 A1 | 1/2020 | Ueda |
| 2021/0074770 A1* | 3/2021 | Choe ..................... H10K 59/38 |
| 2021/0135164 A1* | 5/2021 | Yu ........................ H10K 50/856 |

FOREIGN PATENT DOCUMENTS

| | | |
|---|---|---|
| CN | 106158905 A | 11/2016 |
| CN | 105448957 B | 6/2018 |
| CN | 108242458 A | 7/2018 |
| CN | 110419264 A | 11/2019 |

* cited by examiner

DISPLAY PANEL AND MANUFACTURING METHOD THEREOF, DISPLAY DEVICE WITH IMPROVED BRIGHTNESS UNIFORMITY

This application claims priority to Chinese Patent Application No. 202010852319.2, filed on Aug. 21, 2020 and entitled "DISPLAY PANEL AND MANUFACTURING METHOD THEREOF, DISPLAY DEVICE", the content of which is incorporated herein by reference in its entirety.

TECHNICAL FIELD

The present application relates to the field of display technologies, and in particular to a display panel and a manufacturing method thereof, and a display device.

BACKGROUND

An organic light emitting diode (OLED) display panel is a new type of display panel on the market. The OLED display panel has the characteristic of self-luminescence. Compared with a liquid crystal display panel, the OLED display panel has many advantages such as wide color gamut, high contrast, and ultralight and ultrathin properties.

SUMMARY

Embodiments of the present application provide a display panel and a manufacturing method thereof, and a display device. The technical solutions are as follows.

In one aspect, a display panel is provided. The display panel includes:
 a substrate;
 a pixel defining layer disposed on the substrate, wherein the pixel defining layer is configured to define a plurality of sub-pixel regions on the substrate; and
 a light-emitting device disposed in each of the sub-pixel regions, wherein the light-emitting device includes a first electrode and a light-emitting layer which are laminated in a direction perpendicular to and away from the substrate;
 wherein the light-emitting layer has a central region and a peripheral region surrounding the central region, the central region of the light-emitting layer covers the first electrode, and the peripheral region of the light-emitting layer is staggered from the first electrode.

Optionally, the pattern formed by an outer boundary of the central region of the light-emitting layer is congruent with the pattern formed by an outer boundary of the first electrode.

Optionally, a thickness at each position in the central region of the light-emitting layer is the same.

Optionally, the pixel defining layer includes a pixel defining structure and a ring-shaped auxiliary support structure connected to the pixel defining structure, the pixel defining structure is configured to define the plurality of sub-pixel regions on the substrate, and the auxiliary support structure is disposed in each of the sub-pixel regions; and
 the first electrode is disposed in the region defined by an inner ring of the auxiliary support structure, and a thickness of the auxiliary support structure is the same as a thickness of the first electrode.

Optionally, the pattern formed by the outer boundary of the first electrode is congruent with the pattern formed by an inner boundary of the auxiliary support structure.

Optionally, the light-emitting layer is formed by an inkjet printing process, and the thickness of the central region of the light-emitting layer is less than a thickness of the peripheral region of the light-emitting layer.

Optionally, the display panel further includes an optical adjustment layer disposed on a side of the light-emitting device away from the substrate, wherein the optical adjustment layer is configured to adjust light from the light-emitting device to increase a light-emergent range of the light-emitting device.

Optionally, the optical adjustment layer includes a plurality of sub-optical adjustment layers which are laminated, and at least two adjacent sub-optical adjustment layers in the plurality of sub-optical adjustment layers satisfy the following condition: a refractive index of the sub-optical adjustment layer on the side close to the light-emitting device is greater than a refractive index of the sub-optical adjustment layer on the side away from the light-emitting device.

Optionally, refractive indexes of the plurality of sub-optical adjustment layers sequentially decrease in the direction perpendicular to and away from the substrate.

Optionally, a material of each of the plurality of sub-optical adjustment layers includes an inorganic material.

Optionally, a refractive index of each of the plurality of sub-optical adjustment layers ranges from 1.8 to 2.6.

Optionally, the display panel further includes an optical uniform layer disposed on a side of the optical adjustment layer away from the substrate, and the optical uniform layer is configured to adjust the light from the optical adjustment layer to divergent light.

Optionally, the optical uniform layer includes a light-transmitting dielectric layer, and a plurality of scattering particles are filled in the light-transmitting dielectric layer.

Optionally, a refractive index of the light-transmitting dielectric layer is less than a refractive index of the optical adjustment layer.

Optionally, the display panel further includes a planarization layer disposed between the optical uniform layer and the optical adjustment layer, and a light-reflecting structure disposed on a side of the planarization layer away from the substrate, wherein the light-reflecting structure is disposed around the optical uniform layer.

Optionally, the light-reflecting structure includes an organic layer and a metal layer which are laminated in a direction parallel to the substrate, wherein the metal layer is disposed between the organic layer and the optical uniform layer.

Optionally, the light-reflecting structure includes an organic layer having light-reflecting properties.

Optionally, the light-emitting device further includes a second electrode disposed on a side of the light-emitting layer away from the first electrode;
 the display panel further includes an encapsulation layer disposed on a side of the optical uniform layer away from the substrate; and
 the substrate includes a driving circuit electrically connected to the light-emitting device.

In another aspect, a method for manufacturing a display panel is provided. The method includes:
 forming a pixel defining layer and a light-emitting device on a substrate;
 wherein the pixel defining layer is configured to define a plurality of sub-pixel regions on the substrate, the light-emitting device is disposed in each of the sub-pixel regions, and the light-emitting device includes a first electrode and a light-emitting layer which are laminated in a direction perpendicular to and away from the substrate; and the light-emitting layer has a central region and a peripheral region surrounding the central region, the central region of the light-emitting layer covers the first electrode, and the peripheral region of the light-emitting layer is staggered from the first electrode.

In yet another aspect, a display device is provided. The display device includes a power supply assembly and a display panel, wherein the power supply assembly is configured to supply power to the display panel, and the display panel includes:

a substrate;

a pixel defining layer disposed on the substrate, wherein the pixel defining layer is configured to define a plurality of sub-pixel regions on the substrate; and a light-emitting device disposed in each of the sub-pixel regions, wherein the light-emitting device includes a first electrode and a light-emitting layer which are laminated in a direction perpendicular to and away from the substrate;

wherein the light-emitting layer has a central region and a peripheral region surrounding the central region, the central region of the light-emitting layer covers the first electrode, and the peripheral region of the light-emitting layer is staggered from the first electrode.

BRIEF DESCRIPTION OF THE DRAWINGS

To describe the technical solutions in the embodiments of the present application more clearly, the following briefly introduces the accompanying drawings required for describing the embodiments. Apparently, the accompanying drawings in the following description show merely some embodiments of the present application, and a person of ordinary skill in the art may still derive other drawings from these accompanying drawings without creative efforts.

DETAILED DESCRIPTION

For clearer descriptions of the objectives, technical solutions, and advantages of the present application, embodiments of the present application are described in detail hereinafter with reference to the accompanying drawings.

Figure 1:
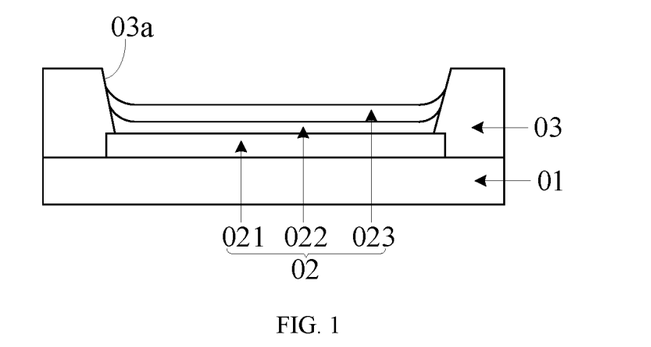
FIG. 1 is a schematic structural diagram of an OLED display panel provided by the related art.

Please refer to FIG. 1, which is a schematic structural diagram of an OLED display panel provided by the related art. The OLED display panel may include a substrate 01, and a pixel defining layer 03 and an OLED light-emitting device 02 which are disposed on the substrate 01. The pixel defining layer 03 is configured to define a pixel region 03a on the substrate 01, and the OLED light-emitting device 02 may be disposed in the pixel region 03a. The OLED light-emitting device 02 may include an anode 021, an organic light-emitting layer 022, and a cathode 023 which are sequentially laminated in a direction perpendicular to and away from the substrate 01.

Currently, an inkjet printing technology may be configured to manufacture the organic light-emitting layer 022 in the OELD display substrate. When the organic light-emitting layer 022 is manufactured by using the inkjet printing technology, the solution in which a light-emitting material is dissolved may be sprayed into the pixel region 03a defined by the pixel defining layer 03, and the organic light-emitting layer 022 may be obtained after curing.

In the process of forming the organic light-emitting layer 022 by using the inkjet printing technology, the solution in which the light-emitting material is dissolved will climb on a sidewall of the pixel defining layer 03. Therefore, a film formation uniformity of the solution in the pixel region 03a is poor, and a thickness of the organic light-emitting layer 022 finally formed in the pixel region 03a varies greatly. For example, the thickness of the organic light-emitting layer 022 disposed in a peripheral region may be greater than the thickness of the organic light-emitting layer 022 disposed in a central region. When the thickness difference of the organic light-emitting layer 022 is relatively large, the brightness difference when the organic light-emitting layer 022 emits light is relatively obvious, and the color of the light emitted by the organic light-emitting layer 022 is also inaccurate, resulting in a relatively poor display effect of the OLED display panel.

Figure 2:
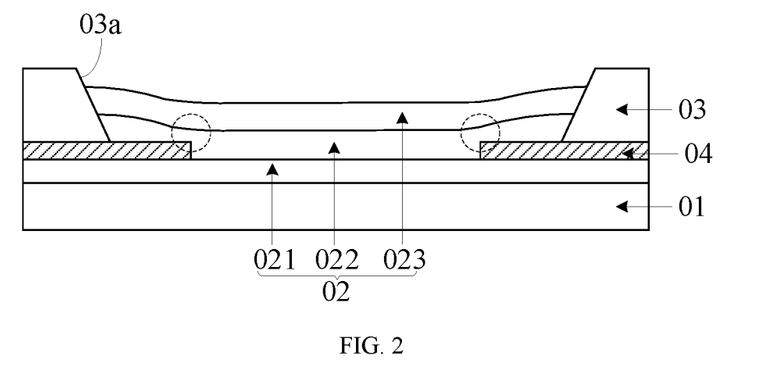
FIG. 2 is a schematic structural diagram of another OLED display panel provided by the related art.

In order to avoid the problem of the poor display effect of the OELD display panel caused by the relatively large thickness difference of the organic light-emitting layer 022, please refer to FIG. 2, which is a schematic structural diagram of another OLED display panel provided by the related art. The OLED display panel may further include an insulating shielding structure 04 disposed between the anode 021 and the pixel defining layer 03. With the shielding structure 04, the contact between the thicker peripheral part of the organic light-emitting layer 022 and the anode 021 can be avoided, so that only a central part of the organic light-emitting layer 022 with a relatively uniform thickness is in contact with the anode 021. Only the part in the organic light-emitting layer 022 that is in contact with the anode 021 emits light. Therefore, when only the central part of the organic light-emitting layer 022 with a relatively uniform thickness is in contact with the anode 021, the brightness difference when the organic light-emitting layer 022 emits light can be reduced, and the display effect of the OELD display panel is improved.

However, in the OELD display panel shown in FIG. 2, the organic light-emitting layer 022 is disposed on the light shielding structure 04. Therefore, the organic light-emitting layer 022 near the edge of the shielding structure 04 (the position marked by a dashed circle in FIG. 2) will have a certain level difference. As a result, the thickness of the organic light-emitting layer 022 at this position is still relatively large. That is, the thickness difference of the part in the organic light-emitting layer 022 that is in contact with the anode 021 is still relatively obvious, resulting in the still poor display effect of the OLED display panel.

Figure 3:
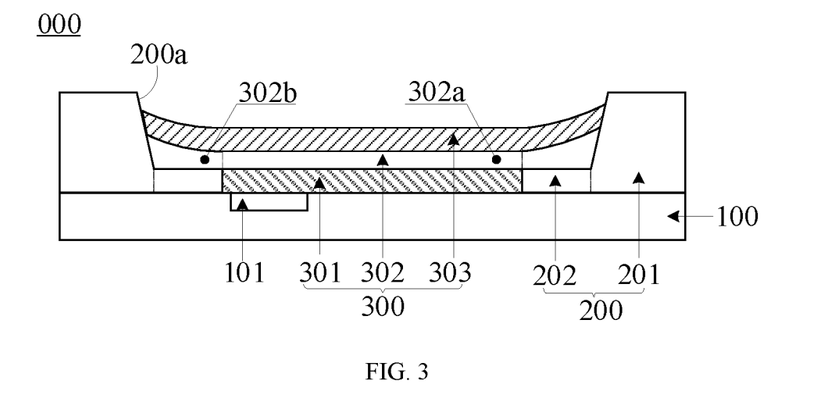
FIG. 3 is a schematic diagram of the structure of film layers of a display panel according to an embodiment of the present application.

Please refer to FIG. 3, which is a schematic diagram of the structure of film layers of a display panel according to the embodiment of the present application. The display panel 000 may include:

a substrate 100, and a pixel defining layer 200 and a light-emitting device 300 which are disposed on the substrate 100.

The pixel defining layer 200 is configured to define a plurality of sub-pixel regions 200a on the substrate 100. There may be a plurality of light-emitting devices 300 on the substrate 100. In addition, the plurality of light-emitting devices 300 correspond to the plurality of sub-pixel regions 200a in a one-to-one correspondence, and each light-emitting device 300 may be disposed in the corresponding sub-pixel region 200a.

The light-emitting device 300 may include: a first electrode 301 and a light-emitting layer 302 which are laminated in a direction perpendicular to and away from the substrate 100. In the embodiment of the present application, the light-emitting device 302 may further include: a second electrode 303 disposed on the light-emitting layer 302 away from the first electrode 301. One of the first electrode 301 and the second electrode 303 may be an anode in the light-emitting device 300, and the other of the first electrode 301 and the second electrode 303 may be a cathode in the light-emitting device 300. Generally, the first electrode 301 may be used as the anode in the light-emitting device 300, and the second electrode 302 may be used as the cathode in the light-emitting device 300. In the light-emitting device 300, when the first electrode 301 and the second electrode 302 are both loaded with corresponding voltages, the light-emitting layer 302 disposed between the first electrode 301 and the second electrode 303 can emit light, so that the light-emitting device 300 can emit light.

The light-emitting layer 302 in the light-emitting device 300 has a central region 302a and a peripheral region 302b surrounding the central region 302a. In the light-emitting device 300, the central region 302a of the light-emitting layer 302 may cover the first electrode 301, and the peripheral region 302b of the light-emitting layer 302 may be staggered from the first electrode 301.

In the embodiment of the present application, when the light-emitting layer 302 in the light-emitting device 300 is manufactured by the inkjet printing process, the thickness of the central region 302a of the light-emitting layer 302 in the light-emitting device 300 is less than the thickness of the peripheral region 302b of the light-emitting layer 302. Moreover, the thickness of the central region 302a of the light-emitting layer 302 is relatively uniform, while the thickness of the peripheral region 302b of the light-emitting layer 302 is not uniform. Exemplarily, the thickness at each position in the central region 302a of the light-emitting layer 302 is the same. The thicknesses at respective positions in the peripheral region 302a of the light-emitting layer 302 gradually increase along the direction from an outer boundary of the central region 302a to an outer boundary of the sub-pixel region 200a.

In the light-emitting device 300 according to the embodiment of the present application, the central region 302a of the light-emitting layer 302 covers the first electrode 301, and the peripheral region 302b in the light-emitting layer 302 is staggered from the first electrode 301. Therefore, in the light-emitting layer 302, the central region 302a with a relatively uniform thickness is in contact with the first electrode 301, and the peripheral region 302b with an uneven thickness is not in contact with the first electrode 301. In this way, when the light-emitting device 300 works, the central region 302a in the light-emitting layer 302 that is in contact with the first electrode 301 can normally emit light, while the peripheral region 302b that is not in contact with the first electrode 301 does not emit light. The brightness difference when the light-emitting layer 302 emits light is effectively reduced, and the accuracy of the color of the light emitted by the light-emitting layer 302 is improved, so that the display effect of the display panel 000 is better. Moreover, there is no need to dispose a shielding structure in the display panel 000, so that the thickness of the central region 302a of the light-emitting layer 302 is more uniform. Besides, the manufacturing complexity of the display panel 000 can be reduced, thereby reducing a manufacturing cost of the display panel 000.

In summary, the display panel according to the embodiment of the present application includes the substrate, and the pixel defining layer and the light-emitting device which are disposed on the substrate. In the light-emitting device, the central region of the light-emitting layer covers the first electrode, and the peripheral region in the light-emitting layer is staggered from the first electrode. Therefore, in the light-emitting layer, the central region with a relatively uniform thickness is in contact with the first electrode, and the peripheral region with an uneven thickness is not in contact with the first electrode. In this way, when the light-emitting device works, the central part of the light-emitting layer that is in contact with the first electrode can normally emit light, and the peripheral region that is not in contact with the first electrode does not emit light. The brightness difference when the light-emitting layer emits light is effectively reduced, and the accuracy of the color of the light emitted by the light-emitting layer is improved, so that the display effect of the display panel is better.

In the embodiment of the present application, as shown in FIG. 3, the pixel defining layer 200 in the display panel 000 may include: a pixel defining structure 201, and a ring-shaped auxiliary support structure 202 connected to the pixel defining structure 201. The pixel defining structure 201 is configured to define the plurality of sub-pixel regions 200a on the substrate 100. The auxiliary support structure 202 may be disposed in each of the sub-pixel regions 200a. In the present application, the first electrode 301 in the light-emitting device 300 may be disposed in the region defined by an inner ring of the annular auxiliary support structure 202, and the thickness of the first electrode 301 is the same as the thickness of the auxiliary support structure 202.

Exemplarily, the pattern of the outer boundary of the first electrode 301 may be congruent with the pattern of an inner boundary of the auxiliary support structure 202. That is, the outer boundary of the first electrode 301 completely coincides with the inner boundary of the auxiliary support structure 202.

In this case, the light-emitting layer 302 in the light-emitting device 300 is disposed in each of the sub-pixel regions 200a, and the light-emitting layer 302 is in contact with the first electrode 301 and the auxiliary support structure 202 at the same time. Therefore, with the auxiliary support structure 202, the phenomenon of a level difference in the thickness direction of the light-emitting layer 302 disposed above the first electrode 301 can be avoided, thereby effectively increasing the thickness uniformity of the central region 302a in the light-emitting layer 302 that is in contact with the first electrode 301.

Figure 4:
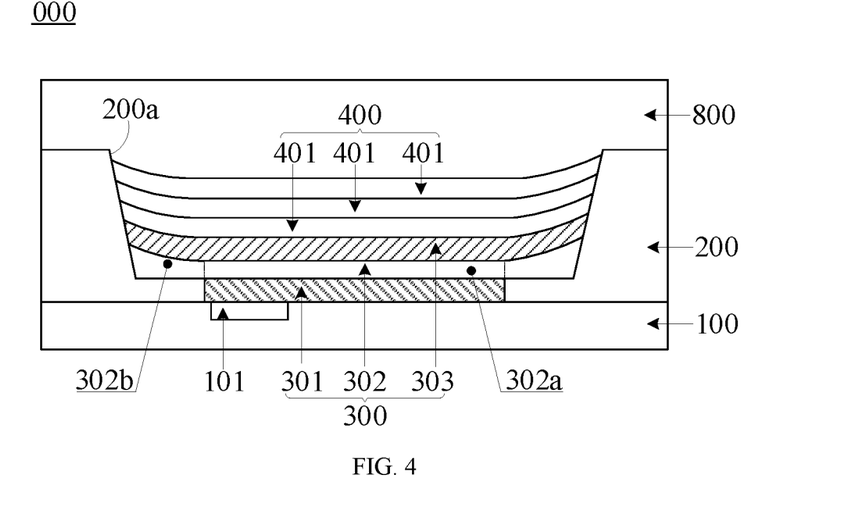
FIG. 4 is a schematic diagram of the structure of film layers of another display panel according to an embodiment of the present application.

Optionally, please refer to FIG. 4, which is a schematic diagram of the structure of film layers of another display panel according to the embodiment of the present application. The pattern formed by the outer boundary of the central region 302a of the light-emitting layer 302 in the light-emitting device 300 in the display panel 000 may be congruent with the pattern formed by the outer boundary of the first electrode 301 in the light-emitting device 300. That is, the outer boundary of the central region 302a of the light-emitting layer 302 completely coincides with the outer edge of the first electrode 301. In the present application, the shape of an orthogonal projection of the first electrode 301 on the substrate 100 may be the same as the shape of an orthogonal projection of the corresponding sub-pixel region 302a on the substrate 100, but the sizes are different. For example, the two may be two rectangles with different sizes. Moreover, the area of the orthogonal projection of the central region 302a in the organic light-emitting layer 302 with a relatively uniform thickness on the substrate 100 usually accounts for 40% to 80% of the area of the orthogonal projection of the entire organic light-emitting layer 302 on the substrate 100. Therefore, the area of the orthogonal projection of the first electrode 301 on the substrate 100 can account for 40% to 80% of the area of the orthogonal projection of the corresponding sub-pixel region 302a on the substrate 100.

In the embodiment of the present application, the light-emitting layer 302 in the light-emitting device 300 may be an organic light-emitting layer. In this case, the light-emitting device 300 may be an OLED device. The light-emitting layer 302 in the light-emitting device 300 may also be a quantum dot light-emitting layer. In this case, the light-emitting device 300 may be a quantum dot light emitting diode (QLED) device.

In the related art, as shown in FIG. 2, when the insulating shielding structure 04 exists between the anode 021 and the pixel defining layer 03, the contact area between the organic light-emitting layer 022 and the anode 021 is relatively small, resulting in a relatively small region that can emit light in the organic light-emitting layer 022. Normally, the area of the orthogonal projection of the region that can emit light in the organic light-emitting layer 022 on the substrate 01 accounts for 40% to 80% of the area of the orthogonal projection of the pixel region 03a defined by the pixel defining layer 03 on the substrate 01. In this way, a pixel aperture ratio of the display panel is reduced, which further reduces the display effect of the display panel.

In the embodiment of the present application, as shown in FIG. 4, the display panel 000 may further include: an optical adjustment layer 400 disposed on a side of the light-emitting device 300 away from the substrate 100. The optical adjustment layer 400 may be disposed on a side of the light-emitting device 300 away from the substrate 100. The optical adjustment layer 400 may adjust the light emitted by the light-emitting device 300 to increase a light-emergent range of the light-emitting device 300. By disposing the optical adjustment layer 400 on a light-emergent side of the light-emitting device 300, the optical adjustment layer 400 can adjust the light emitted by the light-emitting device 300, thereby increasing the light-emergent range of the light-emitting device 300. In this way, even if the contact area between the light-emitting layer 302 and the first electrode 301 in the light-emitting device 300 in the display panel 000 is relatively small, the pixel aperture ratio of the display panel 000 can still be improved with the optical adjustment layer 400, and the display effect of the display panel 000 is further improved.

Exemplarily, the optical adjustment layer 400 on the light-emitting device 300 may include a plurality of sub-optical adjustment layers 401 laminated. The plurality of sub-optical adjustment layers 401 may be sequentially disposed on the light-emitting device 300 in a laminating manner in a direction perpendicular to and away from the substrate 100. At least two adjacent sub-optical adjustment layers 401 in the plurality of sub-optical adjustment layers 401 in the optical adjustment layer 400 satisfy the following condition: a refractive index of the sub-optical adjustment layer 401 on the side close to the light-emitting device 300 is greater than a refractive index of the sub-optical adjustment layer 401 on the side away from the light-emitting device 300. In this way, when the light emitted by the light-emitting device 300 sequentially passes by the two adjacent sub-optical adjustment layers 401 which satisfy this condition, the light emitted by the light-emitting device 300 may be diffused to a direction away from the light-emitting device 300 to increase the light-emergent range of the light-emitting device 300.

For example, refractive indexes of the plurality of sub-optical adjustment layers 401 in the optical adjustment layer 400 may sequentially decrease in the direction perpendicular to and away from the substrate 100. In this case, please refer to FIG. 5, which is a light path diagram of the light emitted by the light-emitting device in the display panel shown in FIG. 4. When the light emitted by the light-emitting device 300 sequentially passes by the plurality of sub-optical adjustment layers 400, the light emitted by the light-emitting device 300 will be deviated to a direction away from the light-emitting device 300 every time the light passes by one sub-optical adjustment layer, thereby increasing the light-emergent range of the light-emitting device 300.

Figure 5:
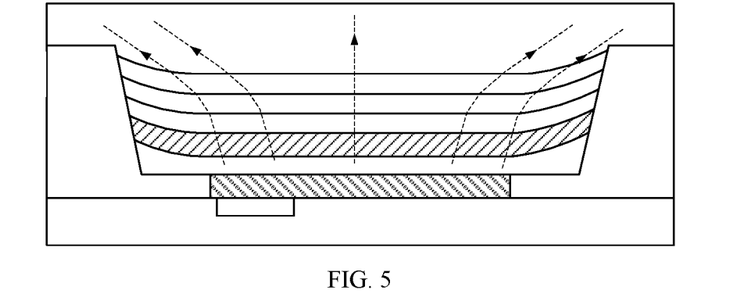
FIG. 5 is a light path diagram of light emitted by a light-emitting device in the display panel shown in FIG. 4.

In the embodiment of the present application, a material of each sub-optical adjustment layer 401 in the plurality of sub-optical adjustment layers 401 may include: an inorganic material. Each sub-optical adjustment layer 401 may also be referred to as an inorganic layer. Besides, the inorganic layer is a transparent inorganic layer. For example, the inorganic material forming the sub-optical adjustment layer 401 may include silicon oxide, silicon nitride, or the like.

A refractive index of each sub-optical adjustment layer 401 in the plurality of sub-optical adjustment layers 401 ranges from 1.8 to 2.6. For example, FIG. 4 and FIG. 5 show three sub-optical adjustment layers 401. In the three sub-optical adjustment layers 401, a refractive index of the sub-optical adjustment layer 401 in contact with the light-emitting device 300 may be 2.5, a refractive index of the sub-optical adjustment layer 401 disposed in the middle may be 2.1, and a refractive index of the sub-optical adjustment layer 401 disposed on the outermost side in the direction away from the light-emitting device 300 may be 1.9.

A total thickness of the optical adjustment layer 400 formed by the plurality of sub-optical adjustment layers 401 may range from 500 nanometers to 1 micron.

Figure 6:
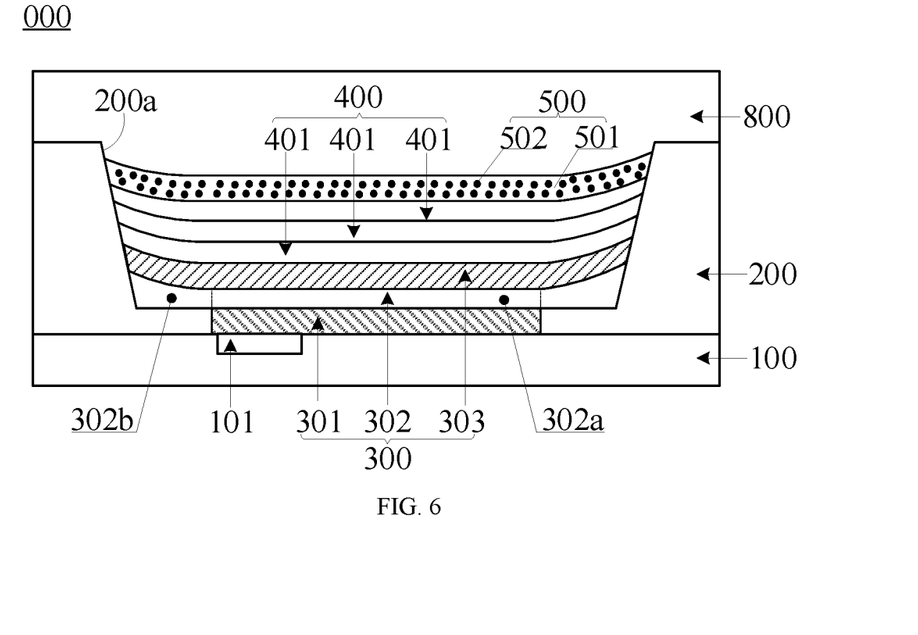
FIG. 6 is a schematic diagram of the structure of film layers of yet another display panel according to an embodiment of the present application.

Optionally, please refer to FIG. 6, which is a schematic diagram of the structure of film layers of yet another display panel according to the embodiment of the present application. The display panel 100 may further include an optical uniform layer 500 disposed on a side of the optical adjustment layer 400 away from the substrate 100. The optical uniform layer 500 is configured to adjust the light from the optical adjustment layer 400 into divergent light.

Exemplarily, the optical uniform layer 500 may include: a light-transmitting dielectric layer 501, and a plurality of scattering particles 502 filled in the light-transmitting dielectric layer 501.

In the present application, in the process that the inkjet printing process is configured to form the light-emitting layer 302 in the light-emitting device 300, the phenomenon that the thickness of the central region 302a of the light-emitting layer 302 is uneven may also occurs. Therefore, in order to improve the uniformity of the light emitted by the light-emitting layer 302, the optical uniform layer 500 may be disposed on the optical adjustment layer 400. In this way, when the light from the optical adjustment layer 400 passes by the scattering particles 502 in the optical uniform layer 500, the light will have a scattering phenomenon, so that the light from the display panel 000 is divergent, thereby improving the uniformity of the light from the display panel 000, and further improving the display effect of the display panel 000.

Figure 7:
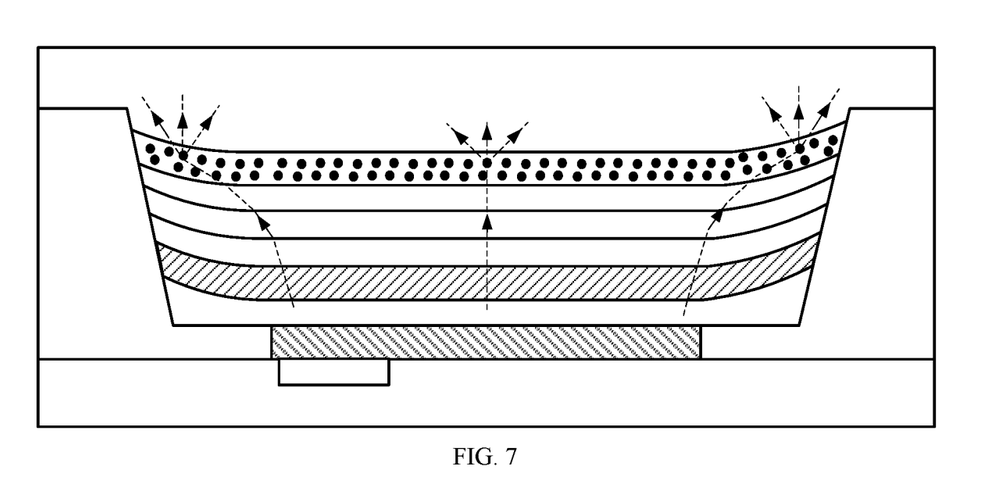
FIG. 7 is a light path diagram of light emitted by a light-emitting device in the display panel shown in FIG. 6.

Exemplarily, please refer to FIG. 7, which is a light path diagram of the light emitted by the light-emitting device in the display panel shown in FIG. 6. After the light emitted by the light-emitting device 300 passes by the optical adjustment layer 400 and exits from the optical adjustment layer 400, the light will have the scattering phenomenon under the action of the scattering particles 502 in the optical uniform layer 500, so that the light from the display panel 000 is divergent.

In the embodiment of the present application, a thickness of the optical uniform layer 500 may range from 1 micrometer to 2 micrometers. A material of the light-transmitting dielectric layer 501 in the optical uniform layer 500 may include a light-transmitting organic material. A transmittance of the light-transmitting dielectric layer 501 to a visible light waveband is higher than 90%. For example, the light-transmitting organic material may be acrylate, epoxy, or the like.

A refractive index of the light-transmitting dielectric layer 501 in the optical uniform layer 500 may be less than a refractive index of the optical adjustment layer 400. For example, the refractive index of the light-transmitting dielectric layer 501 may be less than the refractive index of each sub-optical adjustment layer 401 in the optical adjustment layer 400.

Scattering particles 502 in the optical uniform layer 500 may include: at least one of high-refractive index nanoparticles such as titanium dioxide and barium sulfate. A size of the scattering particles 502 in the optical uniform layer 500 may range from 50 nanometers to 300 nanometers. A mass of the scattering particles 502 in the optical uniform layer 500 accounts for 5% to 20% of a total mass of the optical uniform layer 500.

Figure 8:
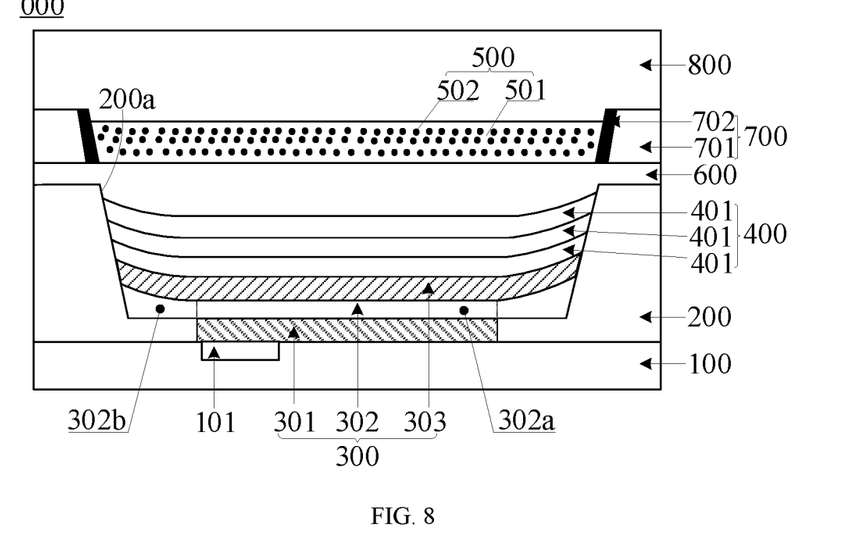
FIG. 8 is a schematic diagram of the structure of film layers of still a further display panel according to an embodiment of the present application.

Optionally, please refer to FIG. 8, which is a schematic diagram of the structure of film layers of still a further display panel according to the embodiment of the present application. The display panel 100 may further include a planarization layer 600 disposed between the optical uniform layer 500 and the optical adjustment layer 400, and a light-reflecting structure 700 disposed on a side of the planarization layer 600 away from the substrate 100. The light-reflecting structure 700 may be disposed around the optical uniform layer 500.

In the present application, when the light emitted by the light-emitting device 300 passes by the optical uniform layer 500, the light will have the scattering phenomenon under the action of the scattering particles in the optical uniform layer 500, and part of the light after passing by the optical uniform layer 500 will not be emergent in a forward direction. Therefore, in order to increase the amount of the light from the forward direction of the display panel 000, the light-reflecting structure 700 may be disposed around the optical uniform layer 500. The light-reflecting structure 700 can reflect the divergent light, so that the reflected light can be from the forward direction, the amount of the light from the forward direction of the display panel 000 is improved, and the display effect of the display panel 000 is further improved.

Figure 9:
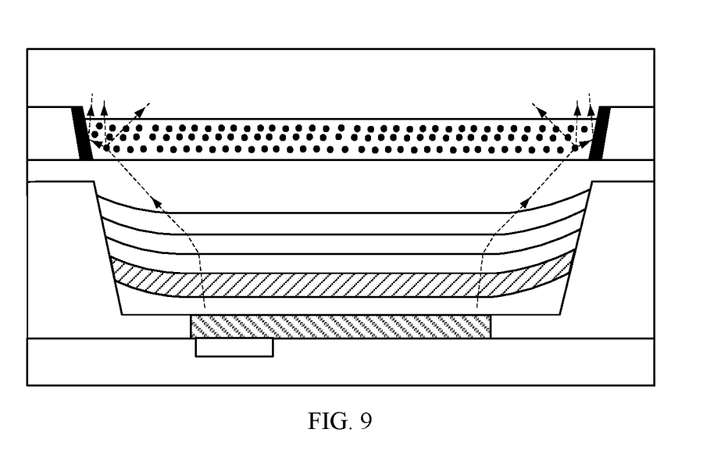
FIG. 9 is a light path diagram of light emitted by a light-emitting device in the display panel shown in FIG. 8.

Exemplarily, please refer to FIG. 9, which is a light path diagram of the light emitted by the light-emitting device in the display panel shown in FIG. 8. After the light emitted by the light-emitting device 300 passes by the optical adjustment layer 400 and the optical uniform layer 500, the divergent light will be reflected by the light-reflecting structure 700 disposed around the optical uniform layer 500, and the reflected light can be from the forward direction of the display panel 100.

In the embodiment of the present application, the light-reflecting structure 700 may include: an organic layer 701 and a metal layer 702 which are laminated in a direction parallel to the substrate 100. The metal layer 702 may be disposed between the organic layer 701 and the optical uniform layer 500. In this case, the organic layer 701 may have a film layer accommodating region for accommodating the optical uniform layer 500. The metal layer 702 may be ring-shaped and is disposed in the film layer accommodating region. The optical uniform layer 500 may be disposed in the region defined by the inner ring of the metal layer 702 and is in contact with the metal layer 702.

A material of the metal layer 702 may be a metal material with a high light reflectivity such as metal aluminum, metal silver or alloys. The metal layer 702 may reflect the divergent light after passing by the optical uniform layer 500.

It should be noted that FIG. 8 schematically illustrates the light-reflecting structure 700 including the organic layer 701 and the metal layer 702 as an example. In other optional implementations, the light-reflecting structure 700 may include: an organic layer having light-reflecting properties. For example, the organic layer may be a gray or yellow organic layer. In this case, the metal layer may not be disposed in the light-reflecting structure 700.

Optionally, as shown in FIG. 4, FIG. 6 or FIG. 8, the display panel 000 may further include: an encapsulation layer 800 for encapsulating the light-emitting device 300. With the encapsulation layer 800, the phenomenon that the light-emitting device 300 fails since components such as water and oxygen in the air enter the light-emitting device 300 can be avoided. Exemplarily, in FIG. 4, the encapsulation layer 800 in the display panel 000 may be disposed on a side of the optical adjustment layer 400 away from the substrate 100. In FIG. 6, the encapsulation layer 800 in the display panel 000 may be disposed on a side of the optical uniform layer 500 away from the substrate 100. In FIG. 8, the encapsulation layer 800 in the display panel 000 may be disposed on a side of the optical uniform layer 500 and the light-reflecting structure 700 away from the substrate 100.

Figure 10:
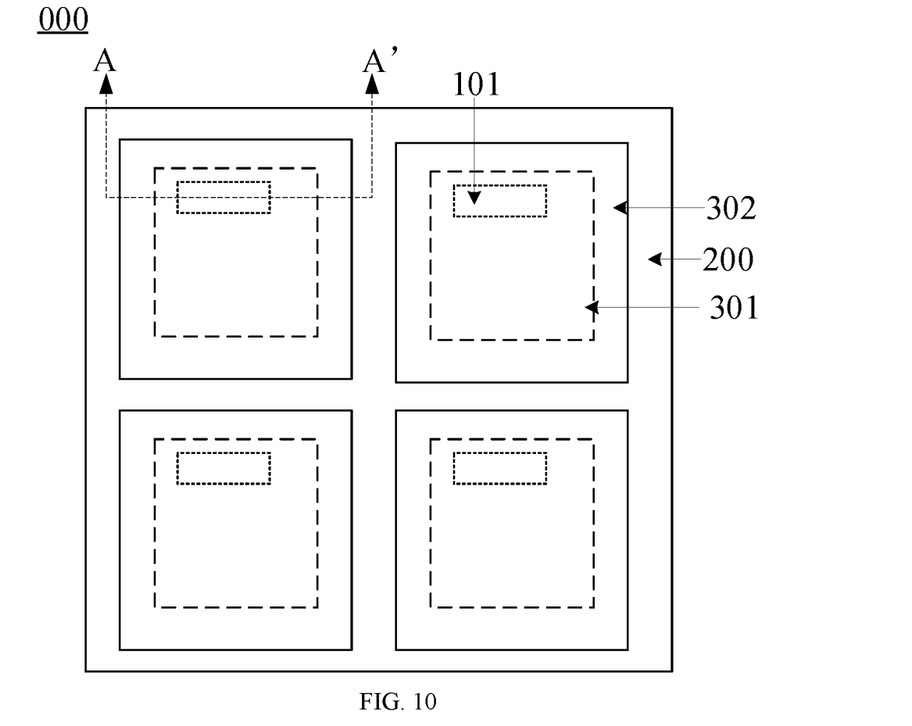
FIG. 10 is a top view of a display panel according to an embodiment of the present application.

In the embodiment of the present application, please refer to FIG. 10, which is a top view of a display panel according to the embodiment of the present application. In the display panel 000, the cross-sectional view at A-A' may refer to the schematic diagram of the film layer structure of the display panel shown in FIG. 4, FIG. 6 or FIG. 8. The substrate 100 in the display panel 000 may include a driving circuit 101 electrically connected to the light-emitting device 300. The driving circuit 101 may be electrically connected to the first electrode 301 in the light-emitting device 300. In the light-emitting device 300, the second electrode 303 may always be loaded with a voltage of 0 volt. When the driving circuit 101 drives the first electrode 301 to load a data voltage, the light-emitting layer 302 disposed between the first electrode 301 and the second electrode 303 can emit light.

Optionally, as shown in FIG. 4, FIG. 6 or FIG. 8, the light-emitting device 300 in the display panel 000 may be a top-emission type light-emitting member. The light emitted by the light-emitting device 300 is emergent toward a direction away from the substrate 100. In this case, the first electrode 301 in the light-emitting device 300 may be a light-reflecting electrode, and the second electrode 303 in the light-emitting device 300 may be a light-transmitting electrode. A material of the light-reflecting electrode may include a metal material such as metal molybdenum, metal copper, metal aluminum or alloys. A material of the light-transmitting electrode may include a transparent conductive material such as indium tin oxide (ITO) or indium zinc oxide (IZO).

In summary, the display panel according to the embodiment of the present application includes the substrate, and the pixel defining layer and the light-emitting device which are disposed on the substrate. In the light-emitting device, the central region of the light-emitting layer covers the first electrode, and the peripheral region in the light-emitting layer is staggered from the first electrode. Therefore, in the light-emitting layer, the central region with a relatively uniform thickness is in contact with the first electrode, and the peripheral region with an uneven thickness is not in contact with the first electrode. In this way, when the light-emitting device works, the central part of the light-emitting layer that is in contact with the first electrode can emit light normally, and the peripheral region that is not in contact with the first electrode does not emit light. The brightness difference when the light-emitting layer emits light is effectively reduced, and the accuracy of the color of the light emitted by the light-emitting layer is improved, so that the display effect of the display panel is improved.

The embodiment of the present application also provides a method for manufacturing a display panel. The method is configured to manufacture the display panel in the above embodiment. The manufacturing method may include:

A pixel defining layer and a light-emitting device are formed on a substrate.

The pixel defining layer is configured to define a plurality of sub-pixel regions on the substrate, and the light-emitting device is disposed in each of the sub-pixel regions. The light-emitting device may include: a first electrode and a light-emitting layer which are laminated in a direction perpendicular to and away from the substrate. The light-emitting layer has a central region and a peripheral region surrounding the central region. The central region of the light-emitting layer covers the first electrode, and the peripheral region of the light-emitting layer is staggered from the first electrode.

In summary, in the method for manufacturing a display panel according to the embodiment of the present application, the pixel defining layer and the light-emitting device are formed on the substrate. In the light-emitting device, the central region of the light-emitting layer covers the first electrode, and the peripheral region in the light-emitting layer is staggered from the first electrode. Therefore, in the light-emitting layer, the central region with a relatively uniform thickness is in contact with the first electrode, and the peripheral region with an uneven thickness is not in contact with the first electrode. In this way, when the light-emitting device works, the central region of the light-emitting layer that is in contact with the first electrode can emit light normally, and the peripheral region that is not in contact with the first electrode does not emit light. The brightness difference when the light-emitting layer emits light is effectively reduced, and the accuracy of the color of the light emitted by the light-emitting layer is improved, so that the display effect of the display panel is better.

Figure 11:
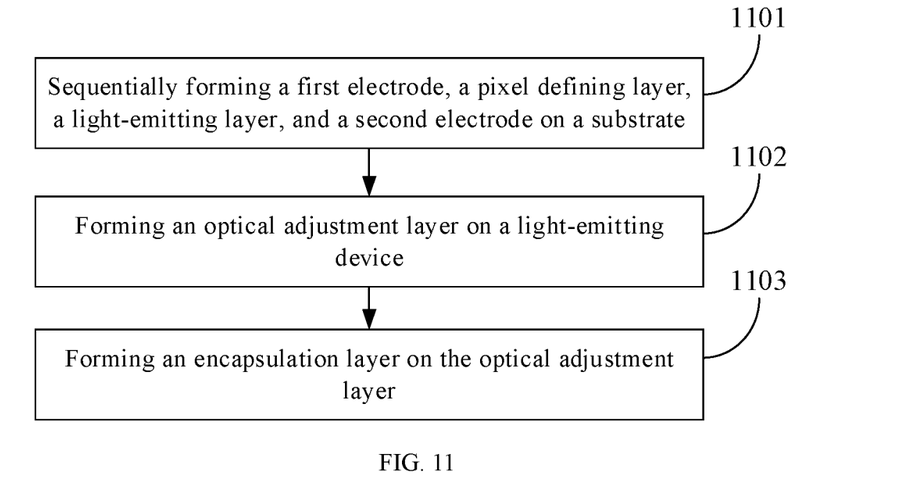
FIG. 11 is a flowchart of a method for manufacturing a display panel according to an embodiment of the present application.

The embodiment of the present application also provides another method for manufacturing a display panel, as shown in FIG. 11, which is a flowchart of the method for manufacturing a display panel according to the embodiment of the present application. The method is configured to manufacture the display panel shown in FIG. 4. The method may include:

In step 1101, a first electrode, a pixel defining layer, a light-emitting layer, and a second electrode are sequentially formed on a substrate.

In the embodiment of the present application, the substrate may be a substrate with a driving circuit. The first electrode, the light-emitting layer, and the second electrode which are formed on the substrate may form a light-emitting device, and the light-emitting device is disposed in a sub-pixel region defined by the pixel defining layer. The first electrode in the light-emitting device may be electrically connected to a driving circuit in the substrate. The light-emitting layer in the light-emitting device has a central region and a peripheral region surrounding the central region. The central region of the light-emitting layer covers the first electrode, and the peripheral region of the light-emitting layer is staggered from the first electrode.

Optionally, the first electrode may be a light-reflecting electrode, and the material thereof may include a metal material such as metal molybdenum, metal copper, metal aluminum, or alloys. The material of the pixel defining layer may include an organic material. The organic material, for example, may be selected from at least one of polymethyl methacrylate-based and polystyrene-based polymers, phenol group-based polymers and derivatives, acrylic-based polymers, p-xylene-based polymers, aryl ether-based polymers, amide-based polymers, fluoride-based polymers, and polymers based on vinyl alcohol of p-xylene-based polymers. The light-emitting layer may be an organic light-emitting layer or a quantum dot light-emitting layer. The second electrode may be a light-transmitting electrode, and the material thereof may include a transparent conductive material such as ITO or IZO.

The above process of sequentially forming the first electrode, the pixel defining layer, the light-emitting layer, and the second electrode on the substrate is as follows:

Firstly, a first conductive material layer may be formed on the substrate by any of a plurality of methods such as deposition, coating, and sputtering, and a single patterning process is performed on the first conductive material layer to form the first electrode. The first electrode may be electrically connected to the driving circuit in the substrate.

Afterwards, an organic material layer may be formed on the substrate on which the first electrode is formed by any of the plurality of methods such as deposition, coating, and sputtering, and the single patterning process is performed on the organic material layer to form the pixel defining layer.

Then, the inkjet printing process may be configured to form the light-emitting layer on the substrate on which the pixel defining layer is formed.

Finally, the second electrode is formed on the substrate on which the light-emitting layer is formed by any of the plurality of methods such as deposition, coating, and sputtering.

It should be noted that the single patterning process in the foregoing embodiment may include: photoresist coating, exposure, development, etching, and photoresist stripping.

In step 1102, an optical adjustment layer is formed on the light-emitting device.

In the embodiment of the present application, the optical adjustment layer may include: a plurality of sub-optical adjustment layers which are laminated. The refractive indexes of the plurality of sub-optical adjustment layers sequentially decrease along a direction perpendicular to and away from the substrate.

Optionally, the refractive index of each sub-optical adjustment layer in the plurality of sub-optical adjustment layers ranges from 1.8 to 2.6. The material of each sub-optical adjustment layer includes an inorganic material. For example, the inorganic material may include silicon oxide or silicon nitride. A total thickness of the optical adjustment layer formed by the plurality of sub-optical adjustment layers may range from 500 nanometers to 1 micron.

Exemplarily, the plurality of sub-optical adjustment layers of which the refractive indexes gradually decrease may be sequentially formed on the substrate on which the light-emitting device is formed by any of the plurality of methods such as deposition, coating, and sputtering.

In step 1103, an encapsulation layer is formed on the optical adjustment layer.

In the embodiment of the present application, the encapsulation layer may be formed on the optical adjustment layer. Optionally, the encapsulation layer may be formed by multiple inorganic layers and organic layers, which are alternately disposed. A material of the inorganic layer may include: silicon oxide, silicon nitride or the like, and a material of the organic layer may include: acrylate, epoxy or the like.

Exemplarily, the encapsulation layer may be formed on the substrate on which the optical adjustment layer is formed by any of the plurality of methods such as deposition, coating, and sputtering.

It should be noted that after the above steps 1101 to 1103, the display panel shown in FIG. 4 may be formed.

Figure 12:
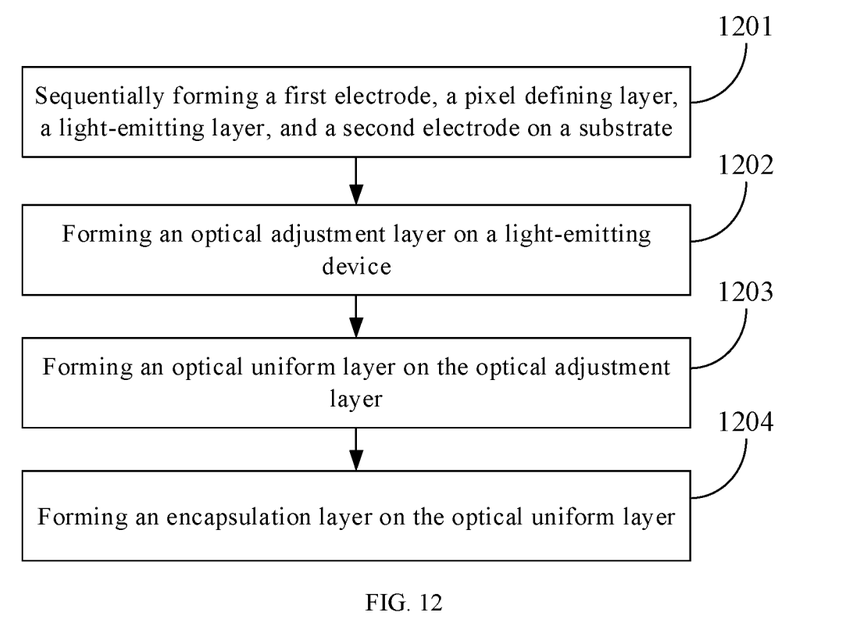
FIG. 12 is a flowchart of another method for manufacturing a display panel according to an embodiment of the present application.

The embodiment of the present application also provides yet another method for manufacturing a display panel, as shown in FIG. 12, which is a flowchart of the method for manufacturing a display panel according to the embodiment of the present application. The method is configured to manufacture the display panel shown in FIG. 6. The method may include:

In step 1201, a first electrode, a pixel defining layer, a light-emitting layer, and a second electrode are sequentially formed on a substrate.

The step 1201 may refer to the aforementioned step 1101, which will not be repeated in the embodiment of the present application.

In step 1202, an optical adjustment layer is formed on a light-emitting device.

The step 1202 may refer to the aforementioned step 1102, which will not be repeated in the embodiment of the present application.

In step 1203, an optical uniform layer is formed on the optical adjustment layer.

In the embodiment of the present application, the optical uniform layer may include: a light-transmitting dielectric layer, and a plurality of scattering particles are filled in the light-transmitting dielectric layer.

Optionally, the thickness of the optical uniform layer may range from 1 micrometer to 2 micrometers. The material of the light-transmitting dielectric layer in the optical uniform layer may include: a light-transmitting organic material. A transmittance of the light-transmitting dielectric layer to a visible light waveband is more than 90%. For example, the light-transmitting organic material may be acrylate, epoxy or the like. The refractive index of the light-transmitting dielectric layer in the optical uniform layer may be less than the refractive index of the optical adjustment layer. The scattering particles in the optical uniform layer may include at least one of high-refractive index nanoparticles such as titanium dioxide and barium sulfate. The size of the scattering particles in the optical uniform layer may range from 50 nanometers to 300 nanometers. The mass of the scattering particles in the optical uniform layer accounts for 5% to 20% of the total mass of the optical uniform layer.

Exemplarily, the optical uniform layer may be formed on the substrate on which the optical adjustment layer is formed by the inkjet printing process. In the process of forming the optical uniform layer by the inkjet printing process, a solution in which a light-transmitting organic material containing the scattering particles is dissolved may be sprayed onto the optical adjustment layer, and the optical uniform layer may be obtained after curing.

In step 1204, an encapsulation layer is formed on the optical uniform layer.

The step 1204 may refer to the aforementioned step 1103, which will not be repeated in the embodiment of the present application.

It should be noted that after the above steps 1201 to 1204, the display panel shown in FIG. 6 may be formed.

Figure 13:
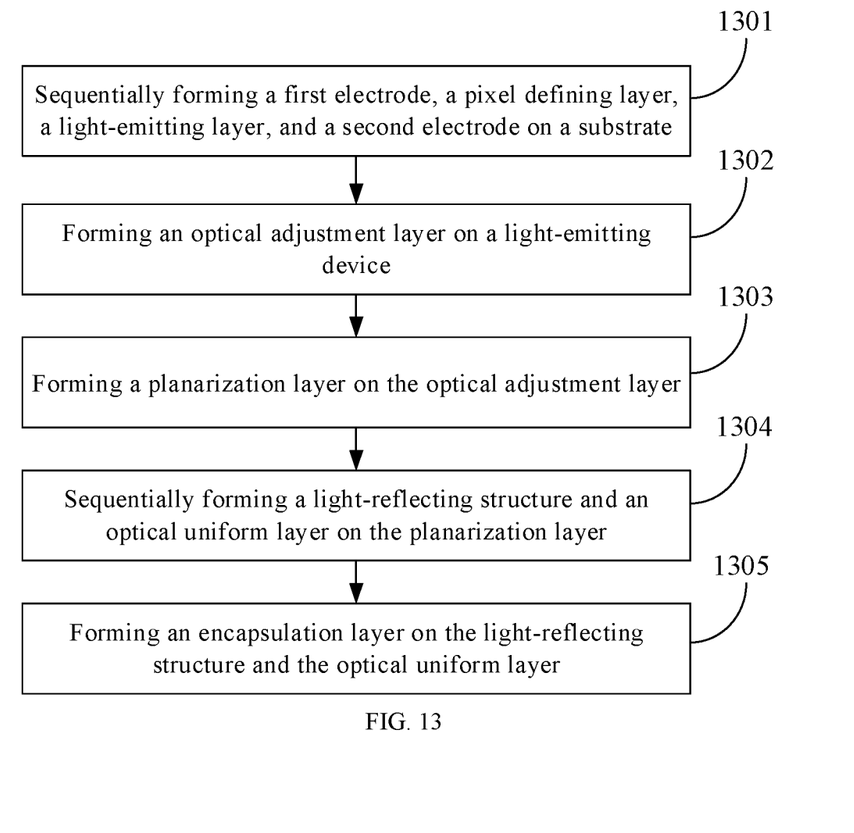
FIG. 13 is a flowchart of yet another method for manufacturing a display panel according to an embodiment of the present application.

The embodiment of the present application also provides still a further method for manufacturing a display panel, as shown in FIG. 13, which is a flowchart of the method for manufacturing a display panel according to the embodiment of the present application. The method is configured to manufacture the display panel shown in FIG. 8. The method may include:

In step 1301, a first electrode, a pixel defining layer, a light-emitting layer, and a second electrode are sequentially formed on a substrate.

The step 1301 may refer to the aforementioned step 1101, which will not be repeated in the embodiment of the present application.

In step 1302, an optical adjustment layer is formed on a light-emitting device.

The step 1302 may refer to the aforementioned step 1102, which will not be repeated in the embodiment of the present application.

In step 1303, a planarization layer is formed on the optical adjustment layer.

Optionally, the material of the planarization layer may include: an organic material such as acrylate or epoxy.

Exemplarily, the planarization layer may be formed on the substrate on which the optical adjustment layer is formed by any of the plurality of methods such as deposition, coating, and sputtering.

In step 1304, a light-reflecting structure and an optical uniform layer are sequentially formed on the planarization layer.

In the embodiment of the present application, the light-reflecting structure may surround the optical uniform layer. The light-reflecting structure may include: an organic layer and a metal layer which are laminated in a direction parallel to the substrate, wherein the metal layer is disposed between the organic layer and the optical uniform layer. Or, the light-reflecting structure may include: an organic layer having light-reflecting properties.

It should be noted that for the manufacturing process of forming the light-reflecting structure on the planarization layer, a low-temperature process should be used for preparing. In this way, the phenomenon of aging of the light-emitting layer due to an excessively high temperature in the preparation process can be avoided. Exemplarily, the material of the organic layer in the light-reflecting structure may be siloxane, and a curing catalyst may be added to the alkylene oxide. In this way, a baking temperature can be controlled in the range of 80-100 degrees Celsius when a pre-baking process is adopted in the film forming process of the light-reflecting structure for baking. When the low-temperature process is not adopted for preparation, the temperature range when the pre-baking process is adopted for baking is 200-400 degrees Celsius.

It should also be noted that the structure and manufacturing process of the optical uniform layer may refer to the corresponding content in the aforementioned step 1203, which is not repeated in the embodiment of the present application.

In step 1305, an encapsulation layer is formed on the light-reflecting structure and the optical uniform layer.

The step 1305 may refer to the aforementioned step 1103, which will not be repeated in the embodiment of the present application.

It should be noted that after the above steps 1301 to 1305, the display panel shown in FIG. 8 may be formed.

Those skilled in the art can clearly understand that, for the convenience and brevity of the description, as to the working principles of respective structures in the above display panel, please refer to the corresponding content in the structure embodiments of the display panel, and details are not described herein again.

In summary, in the method for manufacturing a display panel according to the embodiment of the present application, the pixel defining layer and the light-emitting device are formed on the substrate. In the light-emitting device, the central region of the light-emitting layer covers the first electrode, and the peripheral region in the light-emitting layer is staggered from the first electrode. Therefore, in the light-emitting layer, the central region with a relatively uniform thickness is in contact with the first electrode, and the peripheral region with an uneven thickness is not in contact with the first electrode. In this way, when the light-emitting device works, the central region of the light-emitting layer that is in contact with the first electrode can emit light normally, and the peripheral region that is not in contact with the first electrode does not emit light. The brightness difference when the light-emitting layer emits light is effectively reduced, and the accuracy of the color of the light emitted by the light-emitting layer is improved, so that the display effect of the display panel is better.

The embodiment of the present application also provides a display device, which may include: a power supply assembly and a display panel, wherein the power supply assembly is configured to supply power to the display panel; and a substrate, a pixel defining layer disposed on the substrate, and a light-emitting device disposed in each of the sub-pixel regions.

The pixel defining layer is configured to define a plurality of sub-pixel regions on the substrate. The light-emitting device includes: a first electrode and a light-emitting layer which are laminated in a direction perpendicular to and away from the substrate.

The light-emitting layer has a central region and a peripheral region surrounding the central region. The central region of the light-emitting layer covers the first electrode, and the peripheral region of the light-emitting layer is staggered from the first electrode.

Exemplarily, the structure of film layers of the display panel may refer to the display panel shown in FIG. 3, FIG. 4, FIG. 6 or FIG. 8. The display device may be any product or component with a display function, such as electronic paper, a mobile phone, a tablet computer, a television, a monitor, a notebook computer, a digital photo frame and a navigator.

It should be noted that in the accompanying drawings, for clarity of the illustration, the dimension of the layers and regions may be scaled up. It may be understood that when an element or layer is described as being "above" another element or layer, the described element or layer may be directly on the other element or layer, or at least one intermediate layer may be disposed between the described element or layer and the other element or layer. In addition, it may be understood that when an element or layer is described as being "below" another element or layer, the described element or layer may be directly below the other element or layer, or at least one intermediate layer may be disposed between the described element or layer and the other element or layer. In addition, it may be further understood that when a layer or element is described as being disposed "between" two layers or elements, the described layer or element may be the only layer between the two layers or elements, or at least one intermediate layer or element may be disposed between the described element or layer and the two layers or elements. In the whole description described above, like reference numerals denote like elements.

In the present application, the terms "first" and "second" are used for descriptive purposes only and are not to be construed as indicating or implying relative importance. The term "plurality" refers to two or more, unless specifically defined otherwise.

Described above are merely exemplary embodiments of the present application, and are not intended to limit the present application. Within the essence and principles of the application, any modifications, equivalent substitutions, improvements, and the like are within the protection scope of the present application.

What is claimed is:

1. A display panel, comprising:
   a substrate;
   a pixel defining layer disposed on the substrate, wherein the pixel defining layer is configured to define a plurality of sub-pixel regions on the substrate; and
   a light-emitting device disposed in each of the sub-pixel regions, wherein the light-emitting device comprises a first electrode and a light-emitting layer which are laminated in a direction perpendicular to and away from the substrate;
   wherein the light-emitting layer has a central region and a peripheral region surrounding the central region, the central region of the light-emitting layer covers the first electrode, and the peripheral region of the light-emitting layer is staggered from the first electrode, wherein the display panel further comprises an optical adjustment layer disposed on a side of the light-emitting device away from the substrate, an optical uniform layer disposed on a side of the optical adjustment layer away from the substrate, a planarization layer disposed between the optical uniform layer and the optical adjustment layer, and a light-reflecting structure disposed on a side of the planarization layer away from the substrate, wherein the optical adjustment layer is configured to adjust light from the light-emitting device to increase a light-emergent range of the light-emitting device, and the optical uniform layer is configured to adjust light from the optical adjustment layer to divergent light;

wherein the light-reflecting structure comprises an organic layer and a metal layer which are laminated in a direction parallel to the substrate, wherein the organic layer has a film layer accommodating region for accommodating the optical uniform layer, the metal layer is ring-shaped and is disposed in the film layer accommodating region, the optical uniform layer is disposed in a region defined by an inner ring of the metal layer and is in contact with the metal layer, such that the light-reflecting structure is disposed around the optical uniform layer, and the metal layer is disposed between the organic layer and the optical uniform layer.

2. The display panel according to claim 1, wherein a pattern formed by an outer boundary of the central region of the light-emitting layer is congruent with a pattern formed by an outer boundary of the first electrode.

3. The display panel according to claim 1, wherein a thickness at each position in the central region of the light-emitting layer is the same.

4. The display panel according to claim 1, wherein the pixel defining layer comprises a pixel defining structure and a ring-shaped auxiliary support structure connected to the pixel defining structure, the pixel defining structure is configured to define the plurality of sub-pixel regions on the substrate, and the auxiliary support structure is disposed in each of the sub-pixel regions; and the first electrode is disposed in a region defined by an inner ring of the auxiliary support structure, and a thickness of the auxiliary support structure is the same as a thickness of the first electrode.

5. The display panel according to claim 4, wherein a pattern formed by the outer boundary of the first electrode is congruent with a pattern formed by an inner boundary of the auxiliary support structure.

6. The display panel according to claim 1, wherein the light-emitting layer is formed by an inkjet printing process, and a thickness of the central region of the light-emitting layer is less than a thickness of the peripheral region of the light-emitting layer.

7. The display panel according to claim 1, wherein the optical adjustment layer comprises a plurality of sub-optical adjustment layers which are laminated, and each of at least two adjacent sub-optical adjustment layers in the plurality of sub-optical adjustment layers satisfies: a refractive index of the sub-optical adjustment layer on a side close to the light-emitting device is greater than a refractive index of the sub-optical adjustment layer on a side away from the light-emitting device.

8. The display panel according to claim 7, wherein refractive indexes of the plurality of sub-optical adjustment layers sequentially decrease in the direction perpendicular to and away from the substrate.

9. The display panel according to claim 7, wherein a material of each of the plurality of sub-optical adjustment layers comprises an inorganic material.

10. The display panel according to claim 7, wherein a refractive index of each of the plurality of sub-optical adjustment layers ranges from 1.8 to 2.6.

11. The display panel according to claim 10, wherein the light-emitting device further comprises a second electrode disposed on a side of the light-emitting layer away from the first electrode; and the substrate comprises a driving circuit electrically connected to the light-emitting device.

12. The display panel according to claim 1, wherein the optical uniform layer comprises a light-transmitting dielectric layer, and a plurality of scattering particles are filled in the light-transmitting dielectric layer.

13. The display panel according to claim 12, wherein a refractive index of the light-transmitting dielectric layer is less than a refractive index of the optical adjustment layer.

14. The display panel according to claim 1, wherein the light-reflecting structure comprises an organic layer having light-reflecting properties.

15. A display device, comprising the display panel of claim 1.

16. The display panel according to claim 1, wherein the display panel further comprises an encapsulation layer disposed on a side of the optical uniform layer away from the substrate, and the encapsulation layer comprises multiple inorganic layers and organic layers which are alternately disposed.

17. A method for manufacturing a display panel, comprising forming a pixel defining layer and a light-emitting device on a substrate; and forming an optical adjustment layer, an optical uniform layer, a planarization layer, and a light-reflecting structure, wherein the optical adjustment layer is disposed on a side of the light-emitting device away from the substrate, the optical uniform layer is disposed on a side of the optical adjustment layer away from the substrate, the planarization layer is disposed between the optical uniform layer and the optical adjustment layer, and the light-reflecting structure is disposed on a side of the planarization layer away from the substrate;

wherein the optical adjustment layer is configured to adjust light from the light-emitting device to increase a light-emergent range of the light-emitting device, and the optical uniform layer is configured to adjust light from the optical adjustment layer to divergent light;

wherein the light-reflecting structure comprises an organic layer and a metal layer which are laminated in a direction parallel to the substrate, wherein the organic layer has a film layer accommodating region for accommodating the optical uniform layer, the metal layer is ring-shaped and is disposed in the film layer accommodating region, the optical uniform layer is disposed in a region defined by an inner ring of the metal layer and is in contact with the metal layer, such that the light-reflecting structure is disposed around the optical uniform layer, and the metal layer is disposed between the organic layer and the optical uniform layer;

wherein the pixel defining layer is configured to define a plurality of sub-pixel regions on the substrate, the light-emitting device is disposed in each of the sub-pixel regions, and the light-emitting device comprises a first electrode and a light-emitting layer which are laminated in a direction perpendicular to and away from the substrate; and the light-emitting layer has a central region and a peripheral region surrounding the central region, the central region of the light-emitting layer covers the first electrode, and the peripheral region of the light-emitting layer is staggered from the first electrode.

\* \* \* \* \*